US012620771B2

(12) United States Patent
Gebuhr et al.

(10) Patent No.: US 12,620,771 B2
(45) Date of Patent: May 5, 2026

(54) OPTOELECTRONIC SEMICONDUCTOR COMPONENT AND METHOD FOR PRODUCING AN OPTOELECTRONIC SEMICONDUCTOR COMPONENT

(71) Applicant: ams-OSRAM International GmbH, Regensburg (DE)

(72) Inventors: Tobias Gebuhr, Bad Abbach (DE); Jan Seidenfaden, Neumarkt i.d. Oberpfalz (DE)

(73) Assignee: ams-OSRAM International GmbH, Regensburg (DE)

( * ) Notice: Subject to any disclaimer, the term of this patent is extended or adjusted under 35 U.S.C. 154(b) by 763 days.

(21) Appl. No.: 17/999,508

(22) PCT Filed: May 27, 2021

(86) PCT No.: PCT/EP2021/064201
§ 371 (c)(1),
(2) Date: Nov. 21, 2022

(87) PCT Pub. No.: WO2021/239872
PCT Pub. Date: Dec. 2, 2021

(65) Prior Publication Data
US 2023/0238769 A1 Jul. 27, 2023

(30) Foreign Application Priority Data

May 28, 2020 (DE) .......................... 102020114371.0

(51) Int. Cl.
*H01S 5/00* (2006.01)
*H01S 5/02208* (2021.01)
(Continued)

(52) U.S. Cl.
CPC ...... *H01S 5/02255* (2021.01); *H01S 5/02208* (2013.01); *H01S 5/02234* (2021.01);
(Continued)

(58) Field of Classification Search
CPC ............. H01S 5/02255; H01S 5/02208; H01S 5/02234; H01S 5/0232; H01S 5/02326; H01S 5/06825; H01S 5/02345
See application file for complete search history.

(56) References Cited

U.S. PATENT DOCUMENTS

| 10,256,602 | B2 | 4/2019 | Scholz | |
| 2003/0002822 | A1* | 1/2003 | Ishihara | .............. G02B 6/4246 |
| | | | | 385/36 |

(Continued)

FOREIGN PATENT DOCUMENTS

| CN | 103503181 A | 1/2014 |
| CN | 106663659 A | 5/2017 |

(Continued)

*Primary Examiner* — Kinam Park
(74) *Attorney, Agent, or Firm* — Slater Matsil, LLP

(57) ABSTRACT

In an embodiment an optoelectronic semiconductor component includes a lead frame having a first mounting surface, a semiconductor chip arranged on the first mounting surface and having an emission surface, an optical element and a molded body, wherein the optical element has an input-coupling surface oriented transverse to the first mounting surface, wherein the semiconductor chip is configured to emit electromagnetic radiation through the emission surface, a radiation axis of which is parallel to the first mounting surface, wherein the optical element is configured to deflect the electromagnetic radiation of the semiconductor chip coupled in via the input-coupling surface, wherein the molded body is attached to the lead frame and has an alignment surface transverse to the first mounting surface, and wherein the optical element and the alignment surface are in direct contact with each other.

20 Claims, 4 Drawing Sheets

(51) Int. Cl.

| | |
|---|---|
| *H01S 5/02234* | (2021.01) |
| *H01S 5/02255* | (2021.01) |
| *H01S 5/0232* | (2021.01) |
| *H01S 5/02326* | (2021.01) |
| *H01S 5/068* | (2006.01) |
| *H01S 5/02345* | (2021.01) |

(52) U.S. Cl.
    CPC ........ *H01S 5/0232* (2021.01); *H01S 5/02326*
         (2021.01); *H01S 5/06825* (2013.01); *H01S*
         *5/02345* (2021.01)

(56) References Cited

U.S. PATENT DOCUMENTS

| | | | | |
|---|---|---|---|---|
| 2009/0294789 A1* | 12/2009 | Yoshida | .................. | H01L 24/97 |
| | | | | 257/E33.013 |
| 2012/0187430 A1 | 7/2012 | West et al. | | |
| 2012/0224817 A1* | 9/2012 | Hayashi | ................ | H01S 5/0232 |
| | | | | 385/93 |
| 2014/0175500 A1 | 6/2014 | Kräuter | | |
| 2015/0221585 A1* | 8/2015 | Gebuhr | ............ | H01L 23/49861 |
| | | | | 361/813 |

| | | | | |
|---|---|---|---|---|
| 2016/0043291 A1* | 2/2016 | Gebuhr | ................ | H10H 20/854 |
| | | | | 257/676 |
| 2016/0240756 A1* | 8/2016 | Zitzlsperger | ....... | H10H 20/8506 |
| 2016/0285233 A1 | 9/2016 | Victoria et al. | | |
| 2017/0148959 A1 | 5/2017 | Haiberger | | |
| 2017/0148966 A1 | 5/2017 | Schwarz et al. | | |
| 2017/0237228 A1 | 8/2017 | Gudeman | | |
| 2017/0310079 A1* | 10/2017 | Scholz | ................ | H01S 5/02326 |
| 2018/0287336 A1* | 10/2018 | Victoria | ................ | H01S 5/0233 |
| 2019/0131766 A1 | 5/2019 | Enzmann et al. | | |
| 2019/0157249 A1 | 5/2019 | Nagel | | |
| 2019/0252852 A1 | 8/2019 | Halbritter et al. | | |
| 2019/0319423 A1* | 10/2019 | Yen | ...................... | H01S 5/0427 |
| 2019/0348568 A1 | 11/2019 | König et al. | | |
| 2022/0329039 A1 | 10/2022 | Pinter | | |

FOREIGN PATENT DOCUMENTS

| | | |
|---|---|---|
| CN | 109817795 A | 5/2019 |
| CN | 110474230 A | 11/2019 |
| DE | 10345516 A1 | 5/2005 |
| DE | 102014106882 A1 | 11/2015 |
| DE | 102014114618 A1 | 4/2016 |
| DE | 102019215098 A1 | 4/2021 |

* cited by examiner

OPTOELECTRONIC SEMICONDUCTOR COMPONENT AND METHOD FOR PRODUCING AN OPTOELECTRONIC SEMICONDUCTOR COMPONENT

This patent application is a national phase filing under section 371 of PCT/EP2021/064201, filed May 27, 2021, which claims the priority of German patent application 102020114371.0, filed May 28, 2020, each of which is incorporated herein by reference in its entirety.

TECHNICAL FIELD

An optoelectronic semiconductor component and a method for producing an optoelectronic semiconductor component are disclosed. In particular, the optoelectronic semiconductor component is intended to generate electromagnetic radiation, for example light that is perceptible to the human eye.

SUMMARY

Embodiments provide an optoelectronic semiconductor component that exhibits improved efficiency.

Further embodiments provide a method for producing an optoelectronic semiconductor component that enables simplified production.

According to at least one embodiment, the optoelectronic semiconductor component comprises a lead frame having a first mounting surface. The lead frame is preferably formed with an electrically conductive material. For example, the lead frame is formed with copper, in particular with highly etched copper, with a NiPdAu coating or a NiAg coating. The mounting surface is preferably a main surface of the lead frame and is provided for mounting further components on the lead frame.

According to at least one embodiment, the optoelectronic semiconductor component comprises a semiconductor chip with an emission surface arranged on the first mounting surface. In particular, the semiconductor chip comprises an active region having a pn junction, a double heterostructure, a single quantum well (SQW) structure or a multiple quantum well (MQW) structure for radiation generation.

The semiconductor chip is preferably a laser diode or a light emitting diode. The emission surface of the semiconductor chip is provided for coupling out at least a portion of the electromagnetic radiation generated in the semiconductor chip during operation. For example, the semiconductor chip is an edge-emitting device that emits electromagnetic radiation through one of its side surfaces that is arranged transverse to the main extension direction.

According to at least one embodiment, the optoelectronic semiconductor component comprises an optical element. The optical element is formed with a radiation transmitting material. Preferably, the optical element is arranged to deflect or shape a beam of an electromagnetic radiation. For example, the optical element is a prism or a lens. The optical element comprises, for example, an output-coupling surface through which at least a portion of the electromagnetic radiation coupled into the optical element is coupled out. In particular, the optical element comprises a lateral mounting surface oriented transversely, preferably perpendicularly, to the output-coupling surface. For example, the optical element comprises two lateral mounting surfaces aligned parallel to each other, which laterally limit the lateral extent of the optical element.

According to at least one embodiment of the optoelectronic semiconductor component, the optoelectronic semiconductor component comprises a molded body. In particular, the molded body is formed with a plastic material. For example, the molded body is formed with an epoxy or silicone compound. Epoxy and silicone materials are particularly easy to process and sufficiently resistant to external environmental influences such as moisture or oxygen. Preferably, the material of the molded body is designed to be impermeable to radiation. The molded body is, for example, a mechanically supporting part of the optoelectronic semiconductor component and thus contributes to increasing the mechanical stability of the optoelectronic semiconductor component.

According to at least one embodiment of the optoelectronic semiconductor component, the optical element has an input-coupling surface that is aligned transversely to the first mounting surface. In particular, the input-coupling surface is arranged for coupling electromagnetic radiation from the semiconductor chip into the optical element. Preferably, the input-coupling surface is oriented perpendicular to the first mounting surface.

The terms "perpendicular" and "parallel" are to be understood here and in the following as perpendicular or parallel within the scope of a manufacturing tolerance. Minor deviations are tolerable within the manufacturing tolerances.

According to at least one embodiment of the optoelectronic semiconductor component, the semiconductor chip is arranged to emit electromagnetic radiation through the emission surface whose radiation axis is parallel to the first mounting surface. The electromagnetic radiation propagates, for example, in the form of a radiation cone. In case of doubt, the radiation axis of the electromagnetic radiation is the axis of the radiation cone. Advantageously, this enables particularly simple mounting of a semiconductor chip designed as an edge-emitting laser diode.

According to at least one embodiment of the optoelectronic semiconductor component, the optical element deflects an electromagnetic radiation of the semiconductor chip coupled via the input-coupling surface. For example, an emission of electromagnetic radiation transversely, in particular perpendicularly to the first mounting surface, takes place in this way.

According to at least one embodiment of the optoelectronic semiconductor component, the molded body is formed to the lead frame and has an alignment surface transverse to the first mounting surface. The molded body is preferably in direct contact with the lead frame. In at least one embodiment, a contour of the alignment surface is matched to a contour of the optical element. A contour here and hereinafter means, for example, a waviness, a curvature, or some other three-dimensional shape of a surface.

According to at least one embodiment of the optoelectronic semiconductor component, the optical element and the alignment surface are in direct contact with each other. In particular, the optical element is adjusted relative to the molded body by means of the alignment surface. A spatial position of the optical element relative to the first mounting surface and thus also relative to the semiconductor chip is adjusted, for example, with the aid of the direct arrangement of the optical element on the alignment surface of the molded body.

According to at least one embodiment of the optoelectronic semiconductor component, the optoelectronic semiconductor component comprises:

a lead frame having a first mounting surface, a semiconductor chip having an emission surface arranged on the first mounting surface, an optical element, and a molded body, wherein the optical element comprises an input-coupling surface which is oriented transversely to the first mounting surface, the semiconductor chip is intended to emit electromagnetic radiation through the emission surface whose beam axis is parallel to the first mounting surface, the optical element deflects an electromagnetic radiation of the semiconductor chip coupled via the input-coupling surface, the molded body is formed to the lead frame and has an alignment surface transverse to the first mounting surface, and the optical element and the alignment surface are in direct contact with each other.

An optoelectronic semiconductor component described here is based, among other things, on the following considerations: In the production of semiconductor components with a semiconductor chip and a downstream optical element, a complex alignment of the optical element relative to the semiconductor component is usually necessary in order to ensure the most loss-free possible coupling of electromagnetic radiation from the semiconductor chip into the optical element.

A tilted or skewed coupling of electromagnetic radiation into the optical element leads to a likewise skewed and/or tilted coupling out of electromagnetic radiation from the optical element and thus to a defective semiconductor component. The alignment is performed, for example, by means of mechanical manipulation of an optical element, which is, however, time-consuming.

The optoelectronic semiconductor component described herein makes use, among other things, of the idea of forming a molded body having an alignment surface to a lead frame. When the optical element is mounted, the optical element, or more specifically, a side surface of the optical element, is brought into direct contact with the alignment surface.

With the help of the alignment surface, the optical element is automatically aligned relative to the lead frame and thus also to a semiconductor chip mounted on the lead frame. Advantageously, manual alignment of the optical element relative to the semiconductor chip can thus be dispensed with. The arrangement of molded body with alignment surface and optical element is self-aligning.

According to at least one embodiment of the optoelectronic semiconductor component, the molded body has a cavity. The cavity extends to the first mounting surface. The semiconductor chip is arranged in the cavity. The cavity helps to protect the semiconductor chip, in particular from mechanical damage. Preferably, the cavity projects beyond the semiconductor chip in a direction perpendicular to the first mounting surface.

According to at least one embodiment of the optoelectronic semiconductor component, a side surface of the cavity is formed as an alignment surface. This enables a particularly simple fabrication of the alignment surface.

According to at least one embodiment of the optoelectronic semiconductor component, the optical element is in direct contact with both the alignment surface and the emission surface. Direct contact between two bodies is to be understood, for example, as full-surface contact or also as contact at least in places.

This allows a particularly simple mounting of the optical element without a distance to the emission surface of the semiconductor chip. Such a mounting is advantageous, for example, to achieve a direct coupling of electromagnetic radiation from the semiconductor chip into the optical element.

According to at least one embodiment, the optical element is in direct contact with both the alignment surface and the first mounting surface. This enables a particularly gentle mounting of the optical element, in which the emission surface of the semiconductor chip is not touched by the optical element. Advantageously, a semiconductor chip with a mechanically particularly sensitive emission surface can also be used.

According to at least one embodiment, the optical element is bonded to the optoelectronic semiconductor component by means of an adhesive layer on the first mounting surface or the alignment surface or at least one lateral mounting surface. The adhesive layer is formed with an adhesive, for example. By means of the adhesive layer, a mechanically particularly robust connection of the optical element in the optoelectronic semiconductor component can be achieved.

According to at least one embodiment of the optoelectronic semiconductor component, a radiation-transmissive encapsulation compound is arranged between the emission surface and the optical element. The encapsulation compound preferably has a particularly high radiation transmittance. The encapsulation compound protects the emission surface from damage.

Furthermore, with the help of the encapsulation compound, for example, the refractive index of a region between the optical element and the semiconductor chip is matched to the refractive indices of the optical element and/or the semiconductor chip. In particular, a refractive index of the encapsulation compound is between a refractive index of the semiconductor chip and a refractive index of the optical element. Thus, a particularly low-loss coupling of electromagnetic radiation into the optical element is advantageously achieved.

According to at least one embodiment of the optoelectronic semiconductor component, the optical element causes a deflection of the beam axis of the electromagnetic radiation by an angle of at least 85° and at most 95°.

Preferably, the optical element deflects the beam axis of the coupled radiation by an angle of 90°. For example, the electromagnetic radiation is thus coupled out of the optical element in a direction perpendicular to the first mounting surface, in particular parallel to a normal vector of the first mounting surface.

In a further embodiment, emission occurs parallel to the first mounting surface and perpendicular to a direction in which the radiation emerges from the semiconductor chip to create a so-called side-looker device. The beam axis is thus deflected by 90°, for example, and lies in a plane parallel to the first mounting surface.

According to at least one embodiment of the optoelectronic semiconductor component, the alignment surface includes an angle of at least 130° and of at most 140° with the first mounting surface. Preferably, the alignment surface includes an angle of 135° with the first mounting surface. Such an angle allows a particularly easy mounting of a 90° deflection prism on the alignment surface.

According to at least one embodiment of the optoelectronic semiconductor component, the cavity is filled with a potting compound. The potting compound is in particular impermeable to radiation. The potting compound protects the semiconductor chip and the optical element from external environmental influences. In particular, the potting compound provides the optoelectronic semiconductor component with increased mechanical stability. A radiation-impermeable potting compound contributes in particular to the fact that coupling out of electromagnetic radiation is advantageously limited to the optical element.

According to at least one embodiment of the optoelectronic semiconductor component, the potting compound is flush with an upper edge of the cavity. This enables the formation of a substantially flat surface of the optoelectronic semiconductor component at the level of the upper edge of the cavity. This advantageously facilitates an arrangement of further optical components on the optoelectronic semiconductor component.

According to at least one embodiment of the optoelectronic semiconductor component, the lead frame has a second mounting surface opposite the first mounting surface, which is free of material of the molded body. Such an exposed second mounting surface enables a particularly simple surface mounting of the optoelectronic semiconductor component. Advantageously, a particularly simple electrical connection and a particularly good dissipation of heat from the optoelectronic semiconductor component can thus take place.

According to at least one embodiment of the optoelectronic semiconductor component, the semiconductor chip comprises a carrier body formed with ceramic. The carrier body is provided, for example, for mechanical and electrical contacting of the semiconductor chip with the lead frame. Ceramics have a particularly high thermal conductivity and thus serve to improve the heat dissipation of the semiconductor chip.

A method for producing an optoelectronic semiconductor component described herein is further disclosed. All features disclosed in connection with the method are also disclosed for the optoelectronic semiconductor component and vice versa.

According to at least one embodiment of the method, a lead frame with a first mounting surface is provided. For example, the lead frame is manufactured from a metal sheet by means of a stamping process. Preferably, the first mounting surface is a main surface of the lead frame.

According to at least one embodiment of the process, a molded body is formed on the lead frame in such a way that an alignment surface is formed transverse to the first mounting surface. The molded body is produced in particular with direct contact with the lead frame.

According to at least one embodiment of the method, a semiconductor chip is mounted on the first mounting surface.

According to at least one embodiment of the method, an optical element is arranged on the alignment surface by bringing the alignment surface into direct contact with a side surface of the optical element and aligning the optical element with respect to the semiconductor chip using the alignment surface. In particular, the optical element is aligned relative to the lead frame and thus to the semiconductor chip by means of the alignment surface of the molded body.

Particularly preferably, such a process is used for parallel fabrication of a plurality of semiconductor components.

According to at least one embodiment of the method, a cavity is formed in the molded body that extends to the first mounting surface. The semiconductor chip is mounted in the cavity. Preferably, the cavity is formed during production of the molded body. For example, the cavity is already provided in a mold for producing the molded body.

According to at least one embodiment of the process, the forming of the molded body is performed by means of a transfer molding process. Transfer molding is particularly suitable for forming a cavity while simultaneously forming the molded body.

According to at least one embodiment of the method, a chemical and/or mechanical cleaning step is carried out after the forming of the molded body, which removes residues of the molded body from the first mounting surface. Such a cleaning step facilitates subsequent electrical contacting of components, such as the semiconductor chip, on the first mounting surface.

According to at least one embodiment of the process, the semiconductor chip is assembled by means of bonding, sintering or soldering. Bonding, sintering and soldering are processes that result in a good electrical and thermal connection of the semiconductor chip to the lead frame.

According to at least one embodiment of the process, the cavity is filled with a potting compound by means of jetting or dispensing. Jetting or dispensing enables particularly fast and precise filling of the cavity with the potting compound.

According to at least one embodiment of the process, each of the method steps for producing in a wafer composite is carried out on a plurality of optoelectronic semiconductor components, in particular simultaneously. The parallel processing of a plurality of optoelectronic semiconductor components in a wafer composite makes it possible to produce a particularly high number of units in a process that can be carried out simply and quickly.

According to at least one embodiment of the process, the semiconductor components are separated by means of a sawing process or a laser separation process after the completion of all process steps in a wafer assembly for the production of a plurality of optoelectronic semiconductor components. This advantageously achieves a gentle and particularly precise separation of the individual optoelectronic semiconductor components.

According to at least one embodiment of the method, the lead frame has a second mounting surface opposite the first mounting surface, and the molded body is formed onto the lead frame in such a way that the second mounting surface remains free of material of the molded body. This enables a particularly simple surface mounting of the optoelectronic semiconductor component.

An optoelectronic semiconductor component described herein is particularly suitable for use as a high-power laser diode, for example in video projection applications or 3D printers.

BRIEF DESCRIPTION OF THE DRAWINGS

Further advantages and advantageous designs and further embodiments of the optoelectronic semiconductor component result from the following exemplary embodiments described in connection with the figures.

DETAILED DESCRIPTION OF ILLUSTRATIVE
EMBODIMENTS

Elements that are identical, similar or have the same effect
are given the same reference signs in the figures. The figures
and the proportions of the elements shown in the figures are
not to be regarded as true to scale. Rather, individual
elements may be shown exaggeratedly large for better
representability and/or for better comprehensibility.

Figures 1A, 1B:
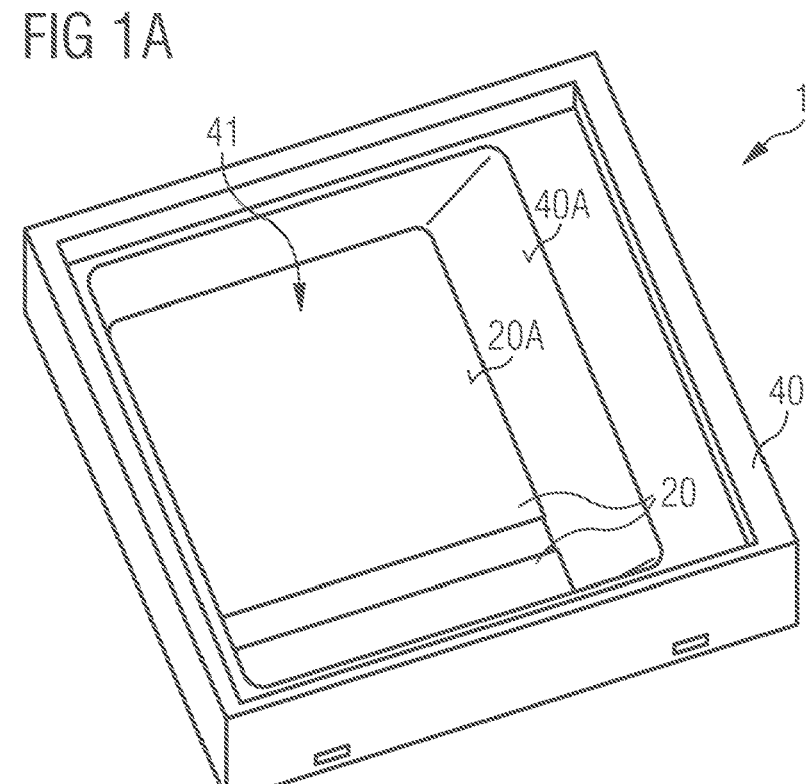
FIGS. 1A to 1E show perspective schematic illustrations of an optoelectronic semiconductor component described herein according to a first exemplary embodiment at various intermediate stages during a process for its production.

FIG. 1A shows a schematic representation of an optoelec-
tronic semiconductor component 1 described herein accord-
ing to a first exemplary embodiment in a first stage of the
process for its production.

The optoelectronic semiconductor component 1 com-
prises a lead frame 20 with a first mounting surface 20A,
which is partially surrounded by a molded body 40 in such
a way that the mounting surface 20A and an adjacent
bonding surface 20C, for example for electrical connection
wires 80 (see FIG. 1C), are exposed. The lead frame 20 is
provided, for example, by a stamping process. The molded
body 40 includes an alignment surface 40A and laterally
completely surrounds the lead frame 20.

The molded body 40 is formed on the lead frame 20 such
that the alignment surface is formed transverse to the first
mounting surface. A cavity 41 is formed in the molded body
40, which completely penetrates the molded body 40 and
extends to the first mounting surface 20A and bonding
surface 20C.

For example, the molded body 40 is transfer molded to the
lead frame 20. Any residues or remnants of the molded body
40 have already been removed from the first mounting
surface 20A and from the bonding surface 20C by means of
a chemical and/or mechanical cleaning step.

FIG. 1B shows the first exemplary embodiment in a
second stage of a method for producing the same. Here, a
semiconductor chip 10 having a carrier body 70 is mounted
in the cavity 41 on the first mounting surface 20A of the lead
frame 20. The carrier body 70 is attached to the mounting
surface 20A of the lead frame 20 by soldering, sintering, or
bonding. Further, a protective diode 11 is disposed on the
carrier body 70 adjacent to the semiconductor chip 10. For
example, the protective diode 11 serves to protect the
semiconductor chip 10 from damage caused by electrostatic
discharge.

Figure 1C:
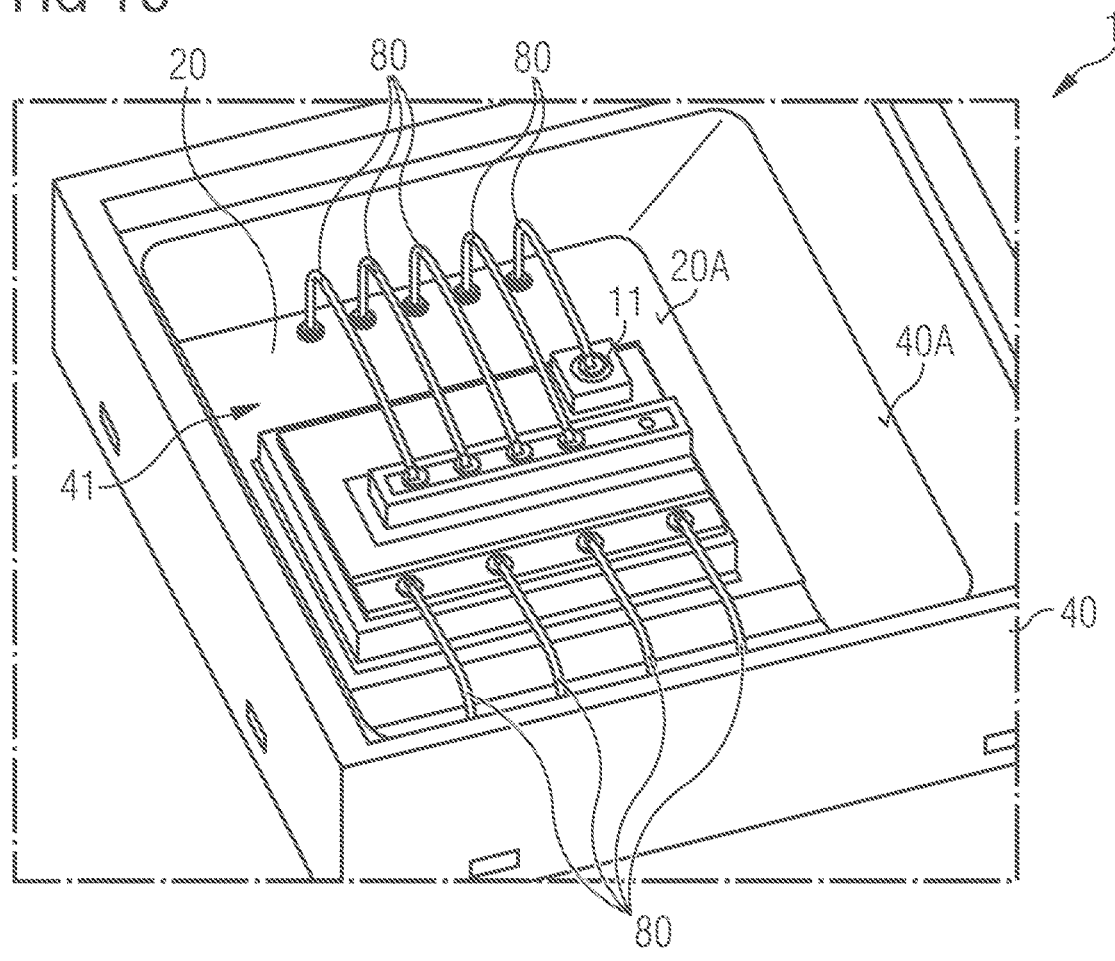

FIG. 1C shows the first exemplary embodiment in a third
stage of a method for its production. Here, a plurality of
bonding wires 80 are provided via which the semiconductor
chip 10, the carrier body 70 and the protective diode 11 are
electrically conductively connected to the lead frame 20.
The bonding wires 80 are formed with gold, for example.

Figure 1D:
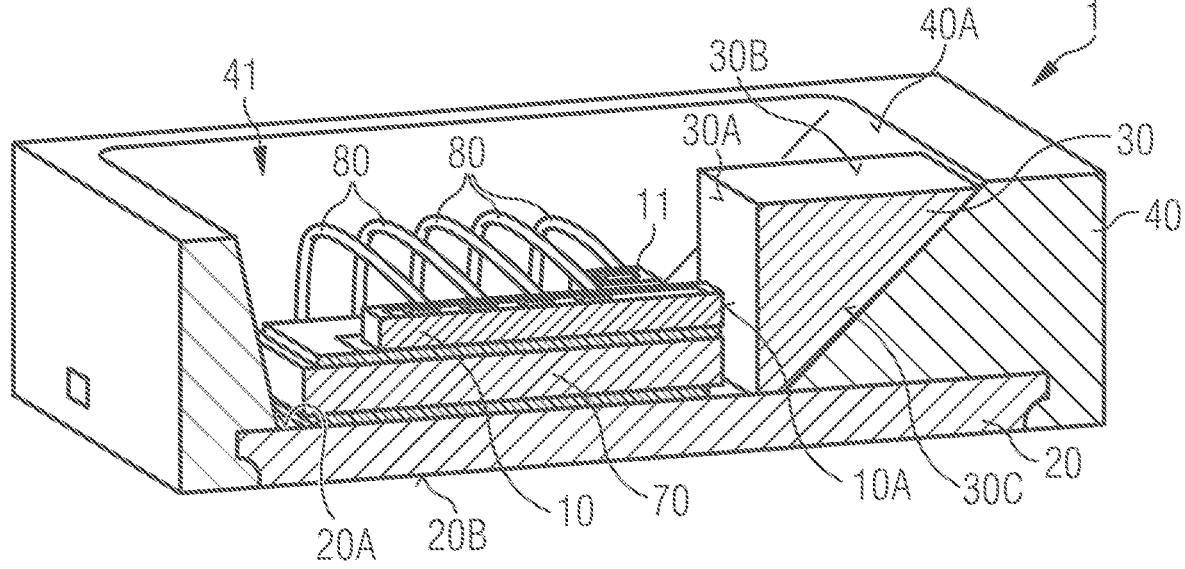

FIG. 1D shows the first exemplary embodiment in a
fourth stage of a method for its production. Here, an optical
element 30 is mounted in the cavity 41 of the molded body
40. The optical element 30 is a deflection prism inserted into
the cavity 41 along an alignment surface 40A of the molded
body 40. A side surface of the cavity 41 is formed as the
alignment surface 40A. Thus, the alignment surface 40A can
be made particularly stable and advantageously simple.

The optical element 30 includes a side surface 30C that
rests directly on the alignment surface 40A of the molded
body 40. Thus, alignment of the optical element 30 relative
to the molded body 40, and thus also to the semiconductor
chip 10, was performed using the alignment surface 40A.
The optical element 30 includes an input-coupling surface
30A, which is aligned such that electromagnetic radiation
from the semiconductor chip 10 exiting via the emission
surface 10A is coupled therethrough into the optical element. Further, the optical element 30 includes an output-
coupling surface 30B through which a majority of the
electromagnetic radiation exits the optical element 30.

In the sectional view shown in FIG. 1D, it can be clearly
seen that the lead frame 20 has a second mounting surface
20B opposite the first mounting surface 20A, which is free
of the material of the molded body 40. Advantageously, this
enables surface mounting of the optoelectronic semiconduc-
tor component 1 via the second mounting surface 20B of the
lead frame 20.

In the first exemplary embodiment, the optical element 30
is in direct contact with the alignment surface 40A and the
first mounting surface 20A of the lead frame 20. Thus, the
optical element 30 is not in contact with the emission surface
10A of the semiconductor chip 10. This is particularly
advantageous when the semiconductor chip 10 has an emis-
sion surface 10A that is sensitive to mechanical contact.

Figure 1E:
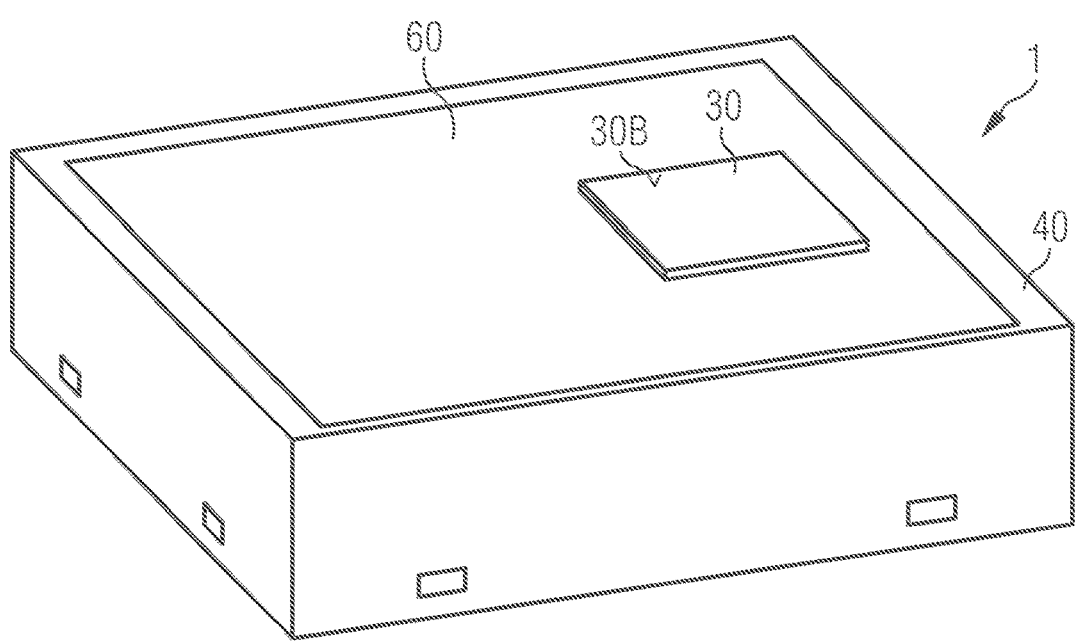

FIG. 1E shows the first exemplary embodiment in a fifth
stage of a method for its production. Here, a potting com-
pound 60 is filled into the cavity 41 of the molded body 40.
Preferably, the filling with the potting compound 60 is done
by jetting or dispensing. The potting compound 60 is flush
with the front side of the molded body 40 and the output-
coupling surface 30B of the optical element 30. Advanta-
geously, this results in a flat surface of the optoelectronic
semiconductor component 1, which simplifies a subsequent
arrangement of further optical elements. The output-cou-
pling surface 30B of the optical element 30 is free of the
material of the potting compound 60.

The potting compound 60 is impermeable to radiation and
formed, for example, with an epoxy material provided with
reflective or absorbent filler. As a result, an escape of
electromagnetic radiation is advantageously limited to the
output-coupling surface 30B of the optical element 30. Thus,
an undesired lateral leakage of scattered radiation is avoided.
Furthermore, the potting compound 60 leads to an additional
mechanical stabilization of the optical element 30 and also
protects the semiconductor chip 10 from external environ-
mental influences.

Figure 2:
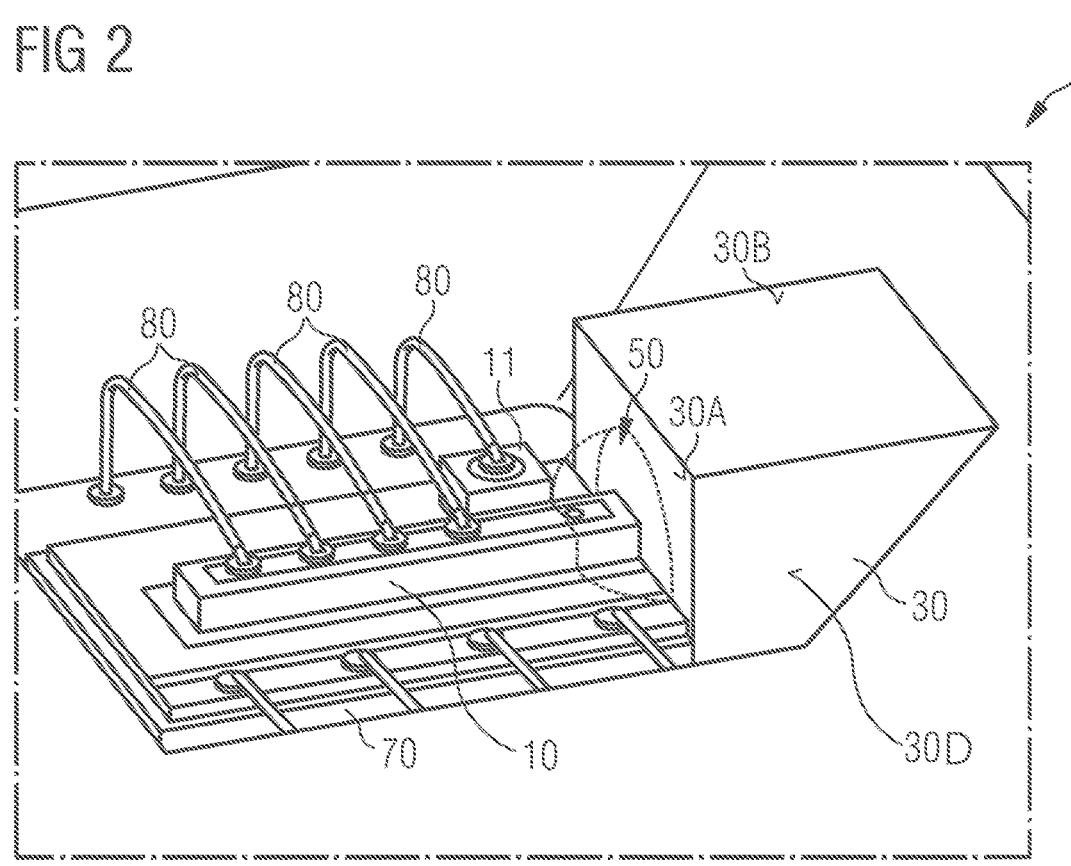
FIG. 2 shows a perspective schematic view of a section of an optoelectronic semiconductor component described herein according to a second exemplary embodiment.

The second exemplary embodiment shown in FIG. 2 is
substantially the same as the first exemplary embodiment. It
differs from the first exemplary embodiment, in particular, in
that an encapsulation compound 50 is provided between the
emission surface 10A of the semiconductor chip 10 and the
optical element 30. The encapsulation compound 50 is
formed with a highly transparent radiation-permeable mate-
rial. Preferably, the encapsulation compound is formed with
a silicone.

The encapsulation compound 50 protects both the emis-
sion surface 10A of the semiconductor chip 10 and the
input-coupling surface 30A of the optical element 30 from
external environmental influences. For example, the encap-
sulation compound 50 is formed such that its refractive
index is formed between the refractive index of the optical
element 30 and the refractive index of the semiconductor
chip 10. For example, the optical element is formed with
glass and has a refractive index of 1.4. The semiconductor
chip is formed with silicon or GaAs, for example, and has a
refractive index between 3.6 and 3.9.

Consequently, a gradual transition from the refractive
index of the semiconductor chip 10 to the refractive index of
the optical element 30 is achieved. A refractive index jump
between the semiconductor chip 10 and the optical element
30 is advantageously reduced and better optical coupling
into the optical element is achievable.

Further, the optical element 30 includes lateral mounting
surfaces 30D. The lateral mounting surfaces 30D are parallel to each other and oriented perpendicular to the input-coupling surface 30A and the output-coupling surface 30B, respectively. For example, an adhesive is disposed between the potting compound 60 and the lateral mounting surfaces 30D to improve mechanical stabilization.

Figure 3:
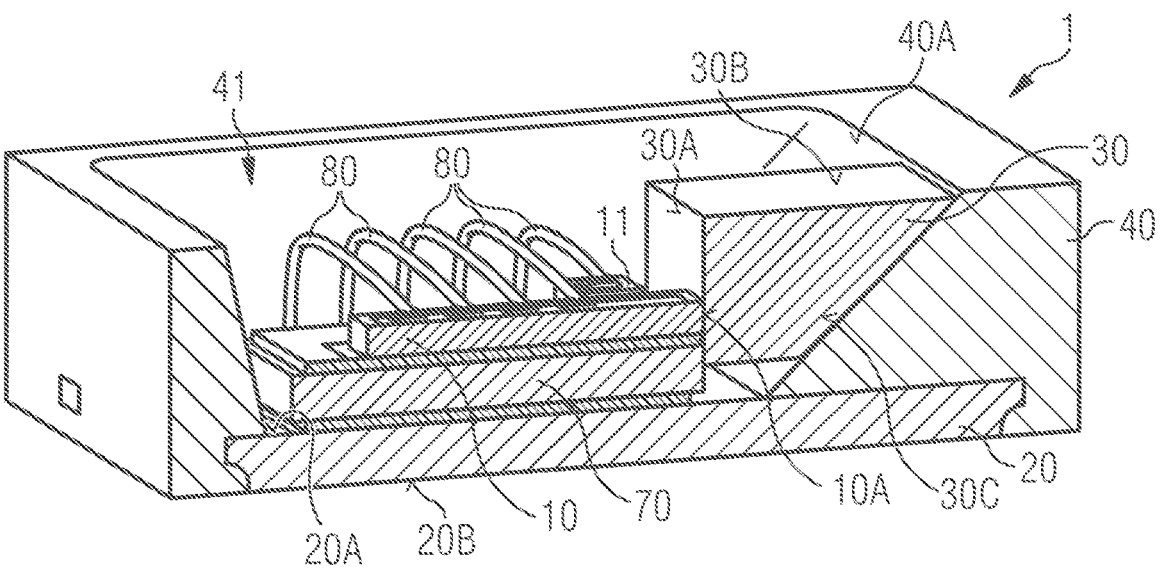
FIG. 3 shows a perspective schematic sectional view of an optoelectronic semiconductor component described herein according to a third exemplary embodiment.

The third exemplary embodiment shown in FIG. 3 is substantially the same as the first exemplary embodiment. It differs from the first exemplary embodiment in particular in that the input-coupling surface 30A of the optical element 30 is in direct contact with the emission surface 10A, at least in places, and forms a direct passage with the semiconductor chip 10.

Here, the optical element 30 is thus in direct contact with the alignment surface 40A of the molded body 40 and the emission surface 10A of the semiconductor chip 10 via its side surface 30C. In particular, the optical element 30 is designed in such a way that it does not touch the first mounting surface 20A of the lead frame 20. Thus, the optical element 30 is automatically adjusted to a zero distance between its input-coupling surface 30A and the emission surface 10A of the semiconductor chip 10. Advantageously, a disturbing air gap between the emission surface 10A of the semiconductor chip 10 and the input-coupling surface 30A of the optical element 30 is thus reduced or avoided.

Figure 4:
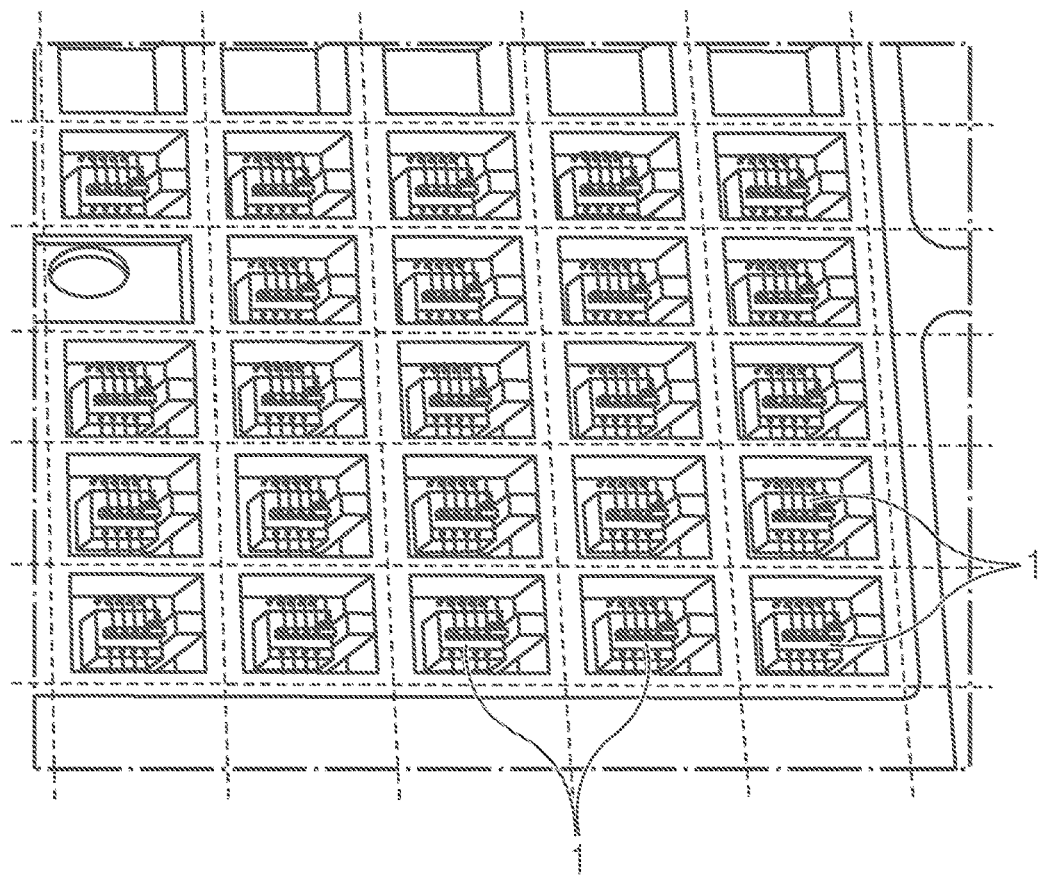
FIG. 4 shows schematic view of a plurality of optoelectronic semiconductor components described herein according to the first exemplary embodiment in a wafer composite.

FIG. 4 shows a schematic view of a plurality of optoelectronic semiconductor components 1 described herein according to the first exemplary embodiment in a wafer compound. The plurality of semiconductor components 1 are arranged in a uniform grid. Along the saw lines shown with dashed lines in FIG. 4, the optoelectronic semiconductor components 1 are subsequently separated by means of a sawing process or a laser separation process. Preferably, a plurality of optoelectronic semiconductor components 1 is produced simultaneously in a particularly simple manner.

The invention is not limited by the description based on the exemplary embodiments. Rather, the invention encompasses any new feature as well as any combination of features, which in particular includes any combination of features in the patent claims, even if this feature or combination itself is not explicitly stated in the patent claims or embodiments.

The invention claimed is:

1. An optoelectronic semiconductor component comprising:
   a lead frame having a first mounting surface;
   a semiconductor chip arranged on the first mounting surface and having an emission surface;
   an optical element; and
   a molded body,
   wherein the optical element has an input-coupling surface oriented transverse to the first mounting surface,
   wherein the semiconductor chip is configured to emit electromagnetic radiation through the emission surface, a radiation axis of which is parallel to the first mounting surface,
   wherein the optical element is configured to deflect the electromagnetic radiation of the semiconductor chip coupled in via the input-coupling surface,
   wherein the molded body is attached to the lead frame and has an alignment surface transverse to the first mounting surface, and
   wherein the optical element and the alignment surface are in direct contact with each other.

2. The optoelectronic semiconductor component according to claim 1, wherein the molded body comprises a cavity, which extends to the first mounting surface and in which the semiconductor chip is arranged.

3. The optoelectronic semiconductor component according to claim 2, wherein a side surface of the cavity is an alignment surface.

4. The optoelectronic semiconductor component according to claim 3, wherein the optical element is in direct contact with both the alignment surface and the emission surface, or both the alignment surface and the first mounting surface.

5. The optoelectronic semiconductor component according to claim 2, wherein the cavity is filled with a potting compound.

6. The optoelectronic semiconductor component according to claim 5, wherein the potting compound is flush with an upper edge of the cavity.

7. The optoelectronic semiconductor component according to claim 1, wherein the optical element is bonded to the optoelectronic semiconductor component by an adhesive layer on the first mounting surface or the alignment surface or at least one lateral mounting surface.

8. The optoelectronic semiconductor component according to claim 1, wherein the optical element is configured to cause the radiation axis to be deflected through an angle of at least 85° and at most 95°.

9. The optoelectronic semiconductor component according to claim 1, wherein the alignment surface includes an angle of at least 130° and at most 140° with the first mounting surface.

10. The optoelectronic semiconductor component according to claim 1, wherein the lead frame has a second mounting surface opposite the first mounting surface, which is free of material of the molded body.

11. A method for producing an optoelectronic semiconductor component, the method comprising:
   providing a lead frame having a first mounting surface;
   forming a molded body to the lead frame such that an alignment surface is formed transverse to the first mounting surface;
   mounting a semiconductor chip on the first mounting surface; and
   arranging an optical element on the alignment surface, wherein the alignment surface is brought into direct contact with the optical element and the optical element is aligned with respect to the semiconductor chip based on the alignment surface, and
   wherein the optical element is brought in direct contact with an emission surface, or
   wherein the optical element is brought in direct contact with the first mounting surface and wherein a radiation-transmissive encapsulation compound is arranged between the emission surface and the optical element.

12. The method according to claim 11, further comprising forming a cavity in the molded body extending to the first mounting surface, wherein the semiconductor chip is mounted in the cavity.

13. The method according to claim 12, further comprising filling the cavity with a potting compound by jetting or dispensing.

14. The method according to claim 11, wherein forming the molded body comprises forming the molded body by a transfer molding process.

15. The method according to claim 11, further comprising, after forming the molded body, performing a chemical and/or mechanical cleaning to remove residues of the molded body from the first mounting surface.

16. The method according to claim 11, wherein the semiconductor chip is mounted by bonding, sintering or soldering.

17. The method according to claim 11, wherein the method is performed in a wafer compound on a plurality of optoelectronic semiconductor components.

18. The method according to claim 17, further comprising, after completion of all method steps, separating the optoelectronic semiconductor components by sawing or laser separating.

19. The method according to claim 11, wherein the lead frame has a second mounting surface opposite the first mounting surface, and wherein the molded body is formed to the lead frame such that the second mounting surface remains free of material of the molded body.

20. An optoelectronic semiconductor component comprising:

a lead frame having a first mounting surface;

a semiconductor chip arranged on the first mounting surface and having an emission surface;

an optical element; and a molded body, wherein the optical element has an input-coupling surface oriented transverse to the first mounting surface, wherein the semiconductor chip is configured to emit electromagnetic radiation through the emission surface, a radiation axis of which being parallel to the first mounting surface, wherein the optical element is configured to deflect the electromagnetic radiation of the semiconductor chip coupled in via the input-coupling surface, wherein the molded body is arranged at the lead frame and has an alignment surface transverse to the first mounting surface, wherein the optical element and the alignment surface are in direct contact with each other, and wherein the optical element is in direct contact with the emission surface, or wherein the optical element is in direct contact with the first mounting surface and a radiation-transmissive encapsulation compound is arranged between the emission surface and the optical element.

* * * * *